US009882537B2

(12) United States Patent
Imai (10) Patent No.: US 9,882,537 B2
(45) Date of Patent: Jan. 30, 2018

(54) OPICAL COUPLING CIRCUIT INCLUDING A LIGHT-RECEIVING UNIT PROVIDED NOT TO RECEIVE OPTICAL SIGNAL, AND SIGNAL PROCESSING DEVICE

(71) Applicant: Renesas Electronics Corporation, Kanagawa (JP)

(72) Inventor: Hitoshi Imai, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 173 days.

(21) Appl. No.: 14/698,998

(22) Filed: Apr. 29, 2015

(65) Prior Publication Data
US 2015/0333841 A1 Nov. 19, 2015

(30) Foreign Application Priority Data
May 13, 2014 (JP) ................. 2014-099437

(51) Int. Cl.
*H03F 3/08* (2006.01)
*H04B 10/80* (2013.01)
(Continued)

(52) U.S. Cl.
CPC ........... *H03F 3/085* (2013.01); *H04B 10/802* (2013.01); *H04B 15/005* (2013.01); *G01J 2001/444* (2013.01)

(58) Field of Classification Search
CPC ......... H03F 3/085; H03F 3/08; H04B 15/005; H04B 10/802; G01J 1/44; G01J 1/4228;
(Continued)

(56) References Cited

U.S. PATENT DOCUMENTS 4,196,360 A * 4/1980 Miller ...................... H03K 5/02
326/30
4,938,062 A * 7/1990 Shimizu .................. G01L 11/02
250/231.19
(Continued)

FOREIGN PATENT DOCUMENTS

JP 63016230 A * 1/1988
JP 2006-340072 A 12/2006

*Primary Examiner* — Que T Le
*Assistant Examiner* — Jennifer Bennett
(74) *Attorney, Agent, or Firm* — Sughrue Mion, PLLC (57) ABSTRACT

A light-emitting unit outputs an optical signal corresponding to an input electric signal. A light-receiving unit is electrically insulated from the light-emitting unit and outputs an electric signal according to the received optical signal as an output signal. In the light-receiving unit, a first light-receiving device outputs an optical current according to the optical signal. A second light-receiving device is provided not to receive the optical signal. A current duplication circuit duplicates a current flowing through the second light-receiving device. A current-voltage conversion circuit converts a current, which is generated by subtracting the current duplicated by the current duplication circuit from a current flowing through the first light-receiving device, into a voltage signal. A comparator output a result of a comparison between the voltage signal converted by the current-voltage conversion circuit and a threshold voltage as the output signal.

9 Claims, 9 Drawing Sheets (51) Int. Cl.
*H04B 15/00* (2006.01)
*G01J 1/44* (2006.01)

(58) Field of Classification Search
CPC ........ G01J 1/10; G01J 1/18; G01J 1/42; G01J 2001/444
USPC ......... 250/214 A, 214 R, 205, 214.1, 214 C; 356/213, 218, 225, 226; 330/288, 59; 327/514
See application file for complete search history.

(56) References Cited

U.S. PATENT DOCUMENTS

| | | | | |
|---|---|---|---|---|
| 5,981,936 | A * | 11/1999 | Fujiie | G11B 7/005 250/214 A |
| 6,885,249 | B2 * | 4/2005 | Suzunaga | H04B 10/69 250/214 A |
| 8,129,671 | B2 * | 3/2012 | Shimizu | H03F 3/08 250/214 A |
| 2002/0019714 | A1 * | 2/2002 | Carliale | G01D 5/24419 702/73 |
| 2006/0273243 | A1 | 12/2006 | Suzunaga | |
| 2009/0085542 | A1 * | 4/2009 | Numano | H03K 17/785 323/282 |

\* cited by examiner

OPICAL COUPLING CIRCUIT INCLUDING A LIGHT-RECEIVING UNIT PROVIDED NOT TO RECEIVE OPTICAL SIGNAL, AND SIGNAL PROCESSING DEVICE

CROSS-REFERENCE TO RELATED APPLICATIONS

This application is based upon and claims the benefit of priority from Japanese patent application No. 2014-99437, filed on May 13, 2014, the disclosure of which is incorporated herein in its entirety by reference.

BACKGROUND

The present invention relates to an optical coupling circuit, a light-receiving apparatus of the optical coupling circuit and a signal processing device An optical coupling circuit (also referred as a photocoupler) is known as a device capable of transmitting a signal while electrically insulating between an input side and an output side. The optical coupling circuit is used in various systems such as an AC servo or an inverter.

The optical coupling circuit inputs an input electric signal to a light-emitting device and converts the input electric signal into an optical signal. The optical signal is received by a light-receiving device that is electrically insulated with the light-emitting device, and converted into an electric signal. The converted electric signal is output to the output side as an output signal.

Thus, it is desirable that the optical coupling circuit can accurately convert the input electric signal into the output signal. However, in general, a capacitive coupling occurs between a light-emitting unit and a light-receiving unit in the optical coupling circuit. Therefore, a noise propagates to the light-receiving unit from the light-emitting unit due to the capacitive coupling. For example, when the noise is large and a signal caused by the noise surpasses a threshold that is a reference for generating the output signal in the light-receiving unit, the case where the output signal is faultily output occurs. Thus, it is required that an effect of the noise is suppressed in the optical coupling circuit. For example, characteristics referred to as Common Mode Rejection (CMR) is required as an index indicating an extent of malfunction prevention with respect to the noise signal propagating between the light-emitting unit and light-receiving unit in the optical coupling circuit.

An optical signal receiving circuit, which generates a voltage signal corresponding to the noise by adding a dummy photo diode and a transimpedance amplifier to eliminate the voltage signal corresponding to the noise from an output signal, is provided as an optical coupling circuit that has noise immunity (Japanese Unexamined Patent Application Publication No. 2006-340072).

In this example, a first transimpedance amplifier converts a first current signal generated by a first photo diode to which an optical signal is input into a first voltage signal. A second transimpedance amplifier converts a second current signal generated by a second photo diode that is configured so that the optical signal is not input into a second voltage signal. The first voltage signal and second voltage signal are input to a comparator and a comparison result is output as the output signal.

In this optical signal receiving circuit, when a noise signal is detected, a voltage of one of the first voltage signal and second voltage signal is shifted to increase a voltage difference between thereof. Thus, the effect of the noise is canceled by the comparator. As a result, the effect of the noise can be eliminated from the output signal.

SUMMARY

However, the inventor has found out the following problems in the above-mentioned optical signal receiving circuit. In the above-mentioned optical signal receiving circuit, the comparator cancels the noise. However, a direction of the noise signal the immunity of which can be improved according to abilities of the comparator and a power supply that supplies power to the comparator is limited. In other words, when the first voltage signal and second voltage signal are descended by the noise, an anti-operation direction noise is caused so that a case where the noise cannot be completely eliminated is arisen. Further, when a voltage variation due to the noise exceeds internal dynamic ranges of the first transimpedance and second transimpedance, the comparator cannot eliminate the noise.

Other issues and new features will be apparent from descriptions and attached drawings of the specification.

An aspect of any one of embodiments is an optical coupling circuit, including: a light-emitting unit that outputs an optical signal corresponding to an input electric signal; and a light-receiving unit that is electrically insulated from the light-emitting unit and outputs an electric signal according to the received optical signal as an output signal. The light-receiving unit includes; a first light-receiving device that outputs an optical current according to the optical signal; a second light-receiving device that is provided not to receive the optical signal; a current duplication circuit that duplicates a current flowing through the second light-receiving device; a current-voltage conversion circuit that converts a current, which is generated by subtracting the current duplicated by the current duplication circuit from a current flowing through the first light-receiving device, into a voltage signal; and a comparator that output a result of a comparison between the voltage signal converted by the current-voltage conversion circuit and a threshold voltage as the output signal.

An aspect of any one of embodiments is a light-receiving apparatus of an optical coupling circuit, including: a first light-receiving device that outputs an optical current according to the optical signal; a second light-receiving device that is provided not to receive the optical signal; a current duplication circuit that duplicates a current flowing through the second light-receiving device; a current-voltage conversion circuit that converts a current, which is generated by subtracting the current duplicated by the current duplication circuit from a current flowing through the first light-receiving device, into a voltage signal; and a comparator that output a result of a comparison between the voltage signal converted by the current-voltage conversion circuit and a threshold voltage as the output signal.

An aspect of any one of embodiments is a signal processing apparatus, including: a signal generation unit that outputs an output electric signal according to an input electric signal; and an optical coupling circuit to which an electric signal is applied, an input and an output thereof are electrically insulated. The optical coupling circuit is inserted one or both of a path through which the input electric signal is input to the signal generation unit and a path through which the output electric signal is output from the signal generation unit. The optical coupling circuit includes; a light-emitting unit that outputs an optical signal corresponding to an input electric signal; and a light-receiving unit that is electrically insulated from the light-emitting unit and outputs an electric signal according to the received optical signal as an output signal. The light-receiving unit includes; a first light-receiving device that outputs an optical current according to the optical signal; a second light-receiving device that is provided not to receive the optical signal; a current duplication circuit that duplicates a current flowing through the second light-receiving device; a current-voltage conversion circuit that converts a current, which is generated by subtracting the current duplicated by the current duplication circuit from a current flowing through the first light-receiving device, into a voltage signal; and a comparator that output a result of a comparison between the voltage signal converted by the current-voltage conversion circuit and a threshold voltage as the output signal.

According to any one of embodiments, it is possible to eliminate a noise from an output signal in an optical coupling circuit regardless of a property of the noise.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiments of the present invention will be described hereinafter with reference to the drawings. In the drawings, the same elements are denoted by the same reference symbols and redundant description will be omitted.

First Embodiment

Figure 1:
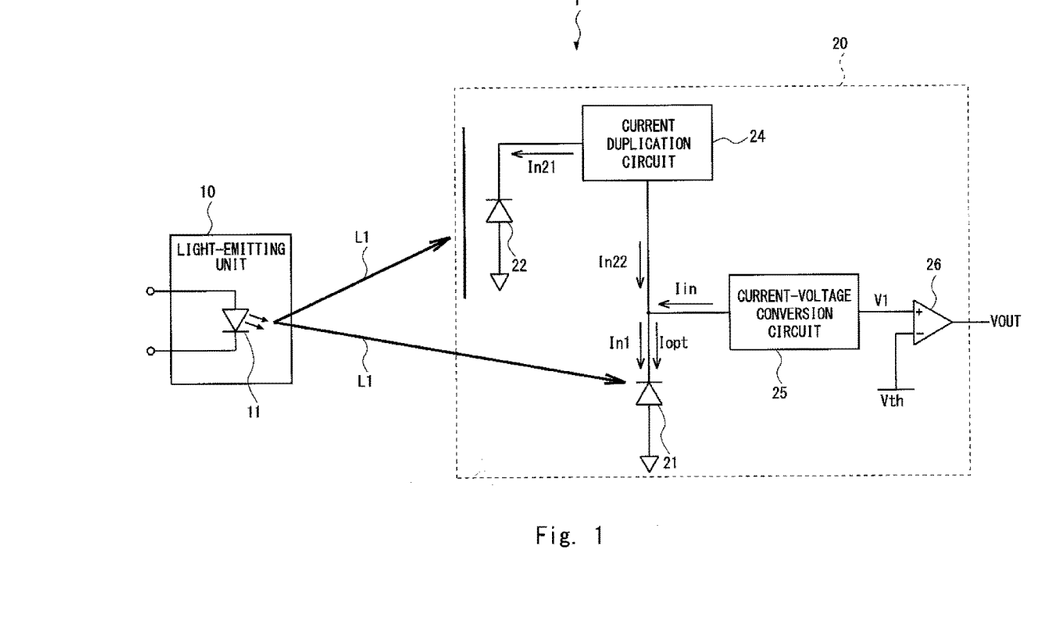
FIG. 1 is a block diagram schematically showing a configuration of a photocoupler according to a first embodiment.

A photocoupler (an optical coupling circuit) according to a first embodiment will be described. FIG. 1 is a block diagram schematically showing a configuration of a photocoupler 1 according to the first embodiment. The photocoupler 1 includes a light-emitting unit 10 that is a primary side and a light-receiving unit 20 that is a secondary side. The light-emitting unit 10 and the light-receiving 20 unit are electrically insulated. Note that the light-emitting unit and the light-receiving unit of the photocoupler are referred to as a light-emitting apparatus and a light-receiving apparatus, respectively.

The light-emitting unit 10 includes a light-emitting device 11. For example, a light-emitting diode (LED) is used as the light-emitting device 11. In an example of FIG. 1, an optical signal L1 is generated by applying a forward direction voltage to the light-emitting device 11.

The light-receiving unit 20 includes a photo diode and converts the optical signal L1 received by the photo diode into an electric signal. A current signal output from the photo diode is converted into a voltage signal and the converted signal is output as an output signal VOUT.

Figure 2:
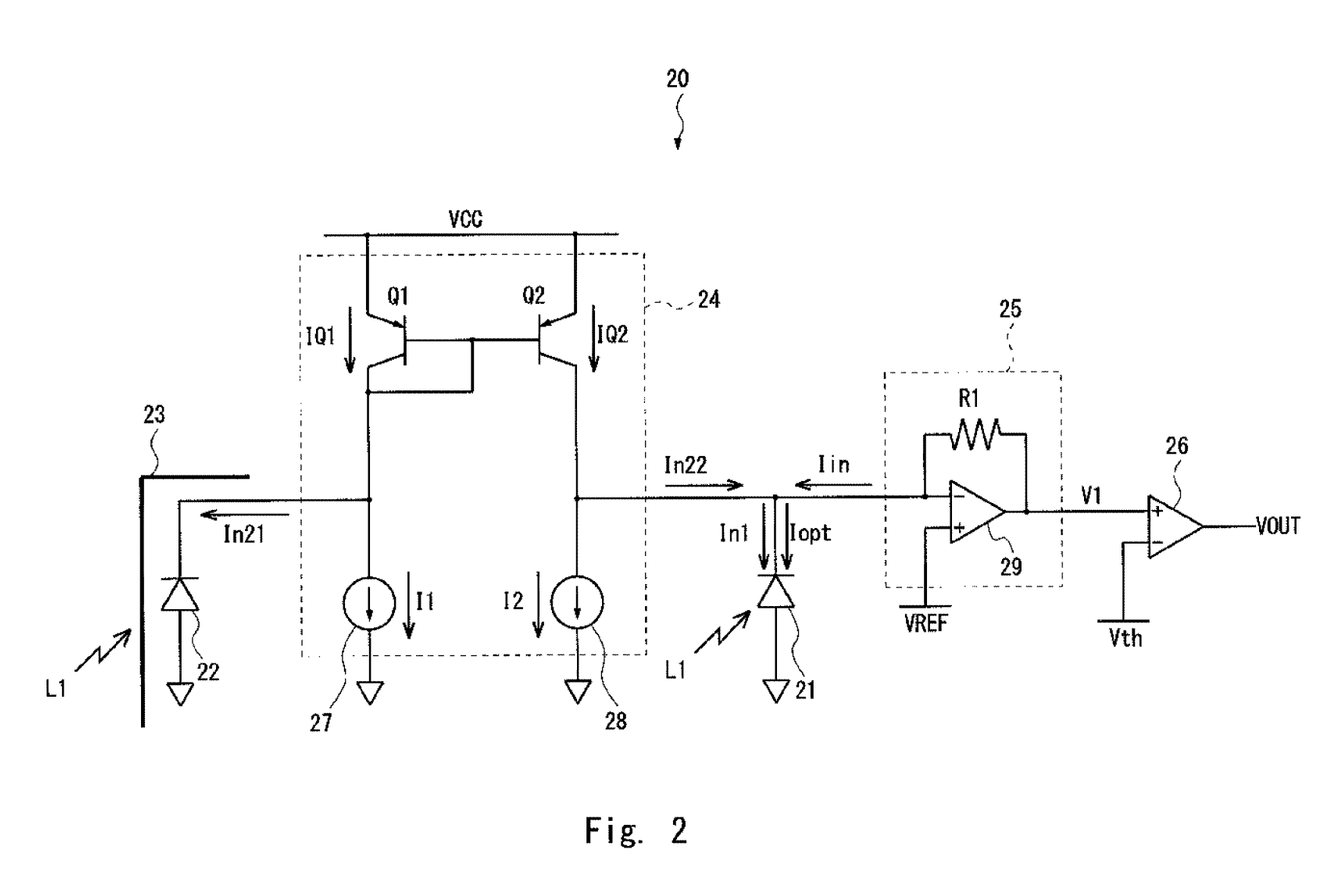
FIG. 2 is a circuit diagram more precisely showing a configuration of the photocoupler according to the first embodiment.

FIG. 2 is a circuit diagram more precisely showing a configuration of the photocoupler 1 according to the first embodiment. The light-receiving unit 20 includes an optical signal detection photo diode 21, a noise detection photo diode 22, a light shielding member 23, a current duplication circuit 24, a current-voltage conversion circuit 25, and comparator 26.

The anode of the optical signal detection photo diode 21 is connected to a ground. As described below, the cathode of the optical signal detection photo diode 21 is connected to the current duplication circuit 24 and the current-voltage conversion circuit 25. In the optical signal detection photo diode 21, an optical current Iopt corresponding to an intensity of the optical signal L1 flows therethrough by receiving and photoelectrically converting the optical signal L1. In the optical signal detection photo diode 21, a noise current In1, which is caused by a capacitive coupling between the light-emitting unit 10 and the light-receiving unit 20, also flows therethrough.

Figure 3:
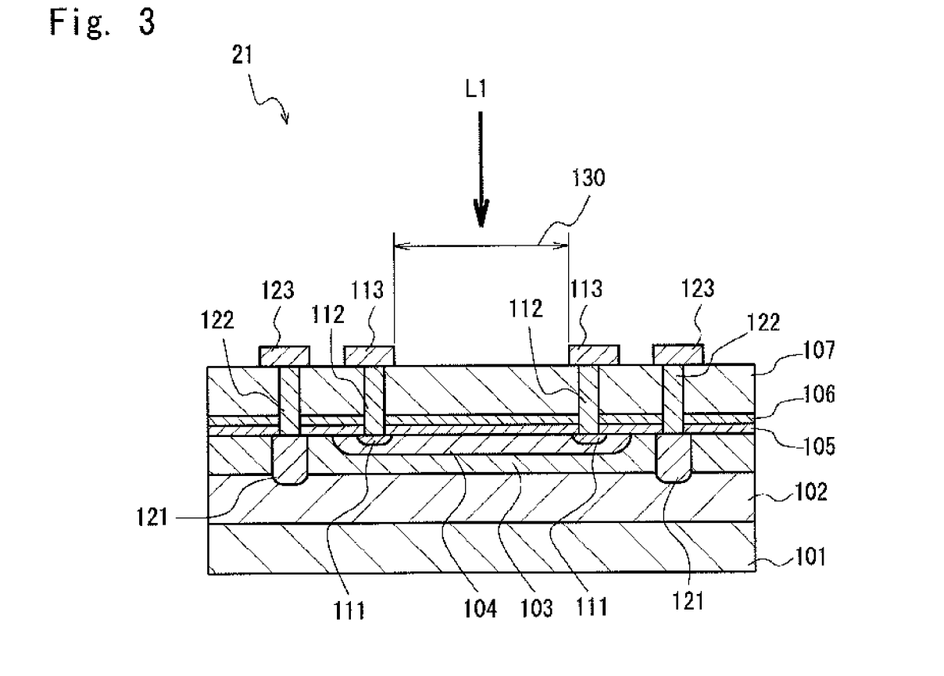
FIG. 3 is a cross-sectional view showing an example of a configuration of an optical signal detection photo diode.

FIG. 3 is a cross-sectional view showing an example of a configuration of the optical signal detection photo diode 21. The optical signal detection photo diode 21 shown in FIG. 3 is a PIN (p-intrinsic-n) type photo diode configured by semiconductor.

In the optical signal detection photo diode 21, a p-type silicon layer 102 that is the anode and a i-silicon layer 103 that is an intrinsic semiconductor layer are formed on a p-type single-crystal silicon substrate 101 in sequence, for example, by an epitaxial growth. An n-type silicon layer 104 that is the cathode is formed in a central-upper part of the i-silicon layer 103. A surface protection film 105 made from insulator and an antireflection film 106 preventing a reflection of the optical signal L1 are formed on the i-silicon layer 103 and n-type silicon layer 104. An interlayer insulating film 107 is formed on the antireflection film 106.

An n-type contact 111 is formed on a part of the n-type silicon layer 104. A cathode side pull-out electrode 112, which penetrates the surface protection film 105, the antireflection film 106 and the interlayer insulating film 107, is formed on the n-type contact 111.

A p-type contact 121 is formed over the p-type silicon layer 102 to penetrate the i-silicon layer 103. An anode side pull-out electrode 122, which penetrates the surface protection film 105, the antireflection film 106 and the interlayer insulating film 107, is formed on the p-type contact 121.

A cathode side aluminum electrode 113 connected to the cathode side pull-out electrode 112 and an anode side aluminum electrode 123 connected to the anode side pull-out electrode 122 are formed on the interlayer insulating film 107. The anode side aluminum electrode 123 is connected to the ground. The cathode side aluminum electrode 113 is connected to the current duplication circuit 24 and the current-voltage conversion circuit 25.

According to the above-described configuration, the optical signal detection photo diode 21 is inversely-biased, thereby outputting a current corresponding to the optical signal L1 incident on a central light-receiving part 130 thereof.

The anode of the noise detection photo diode 22 is connected to the ground. As described below, the cathode of the noise detection photo diode 22 is connected to the current duplication circuit 24. The light shielding member 23 interposes between the noise detection photo diode 22 and the light-emitting unit 10. As the noise detection photo diode 22 is optically shielded by the light shielding member 23, the optical signal L1 is not incident on the noise detection photo diode 22. Therefore, any current do not flow through the noise detection photo diode 22, and a noise current 21 caused by the noise due to a capacitive coupling between the light-emitting unit 10 and the light-receiving unit 20 flows.

Figure 4:
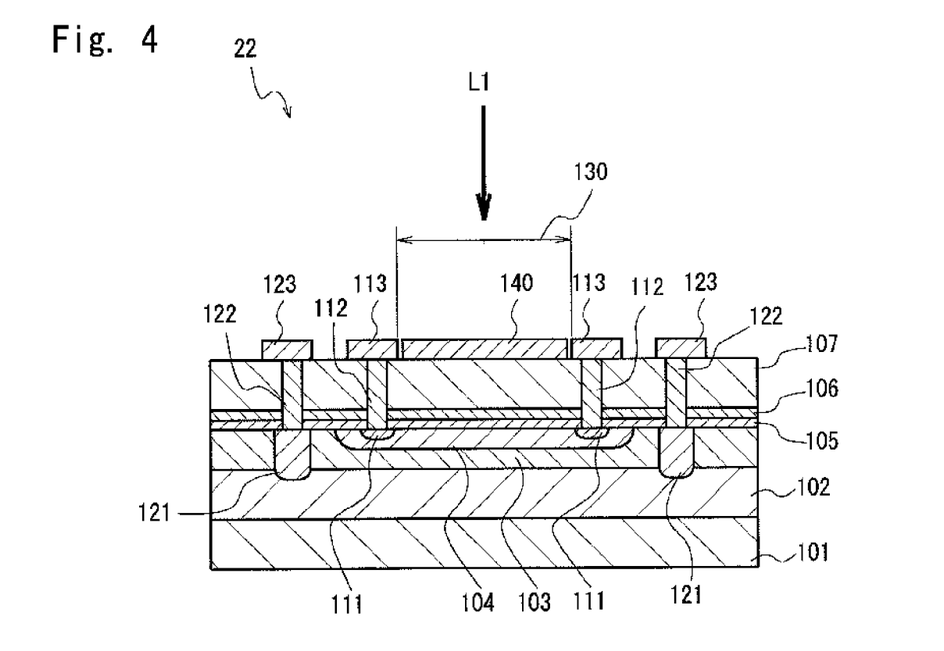
FIG. 4 is a cross-sectional view showing an example of a configuration of a noise detection photo diode.

FIG. 4 is a cross-sectional view showing an example of a configuration of the noise detection photo diode 22. The noise detection photo diode 22 shown in FIG. 4 has a configuration in which a floating aluminum film 140 that functions as the light shielding member 23 is added to the optical signal detection photo diode 21 shown in FIG. 3. The floating aluminum film 140 is formed to cover the central light-receiving part 130 as a same metal film with the anode side aluminum electrode 123 and the cathode side aluminum electrode 113. The floating aluminum film 140 can be formed by the metal film which is the same layer as the anode side aluminum electrode 123 and the cathode side aluminum electrode 113.

As the floating aluminum film 140 is not connected another voltage source, it is at a floating voltage. Thus, while the floating aluminum film 140 shields the optical signal L1 as the light shielding member 23, the capacitive coupling between the light-emitting unit 10 and the noise detection photo diode 22 is not interrupted. Therefore, the noise caused by the capacitive coupling propagates to the noise detection photo diode 22 without being interrupted.

The current duplication circuit 24 includes bipolar transistors Q1 and Q2, constant current sources 27 and 28. In this example, the bipolar transistors Q1 and Q2 are the same size PNP transistors. The emitters of the bipolar transistors Q1 and Q2 are supplied with a power-supply voltage VCC. The collector and the base of the bipolar transistor Q1, the base of the bipolar transistor Q2 are connected each other. The constant current source 27 is inserted between the collector of the bipolar transistor Q1 and the ground. The collector of the bipolar transistor Q1 is also connected to the cathode of the noise detection photo diode 22. The constant current source 27 outputs a constant current I1. The current I1 flowing through the constant current source 27 and a current I2 flowing through the constant current source 28 are designed to make a ratio of 1:1. According to the above description, the bipolar transistors Q1 and Q2, the constant current sources 27 constitute a current mirror circuit the mirror ratio of which is 1:1.

The constant current source 28 is inserted between the collector of the bipolar transistor Q2 and the ground. The constant current source 28 outputs the constant current I2. The collector of the bipolar transistor Q2 is also connected to the cathode of the optical signal detection photo diode 21 and the current-voltage conversion circuit 25, and outputs an output current In22.

The current-voltage conversion circuit 25 converts an output current Iin, which flows into the optical signal detection photo diode 21 from the current-voltage conversion circuit 25, into a voltage signal V1. The current-voltage conversion circuit 25 includes a differential amplifier 29 and a resistor R1. The inverting input terminal of the differential amplifier 29 is connected to the collector of the bipolar transistor Q2 and the cathode of the optical signal detection photo diode 21. A reference voltage VREF is input to the non-inverting input terminal of the differential amplifier 29. The resistor R1 is connected between the inverting input terminal and an output terminal of the differential amplifier 29.

The non-inverting input terminal of the comparator 26 is connected to an output terminal of the current-voltage conversion circuit 25 (the output terminal of the differential amplifier 29). The voltage signal V1 is input to the non-inverting input terminal of the comparator 26. A threshold voltage Vth is input to the inverting input terminal of the comparator 26. The output signal VOUT, which is a result of comparison of the voltage signal V1 and the threshold voltage Vth, is output from an output terminal of the comparator 26. In this example, when the voltage signal V1 is larger than the threshold voltage Vth (V1>Vth), the output signal VOUT is HIGH. When the voltage signal V1 is smaller than the threshold voltage Vth (V1<Vth), the output signal VOUT is LOW.

Next, an operation of the photocoupler 1 will be described.

When the optical signal L1 is input to the light-receiving unit 20, the optical current Iopt flows through the optical signal detection photo diode 21. The optical signal detection photo diode 21 is inversely-biased, and the optical current Iopt flows in a direction from the cathode to the anode. When the noise occurs, the noise current In1 is generated from the cathode of the optical signal detection photo diode 21. In the case of defining that a direction in which the noise current In1 flow into the cathode is a plus direction, a current flowing through the optical signal detection photo diode 21 is Iopt+In1.

In contrast, as the noise detection photo diode 22 is optically shielded by the light shielding member 23, the optical current does not flow therethrough, and only the noise current In21 flows when the noise occurs.

Next, a current flowing through the current duplication circuit 24 will be described.

A current IQ1 flows through the bipolar transistor Q1. As the current IQ1 is a current that is a sum of the noise current In21 and the current I1, a following expression (1) is established.

$$IQ1 = In21 + I1 \quad (1)$$

As described above, the bipolar transistors Q1 and Q2, the constant current source 27 constitute the current mirror circuit a mirror ratio of which is 1:1. Therefore, the current IQ2 flowing through the bipolar transistor Q2 is equal to the current IQ1 flowing through the bipolar transistor Q1, and a following expression (2) is established.

$$IQ2 = In21 + I1 \quad (2)$$

As the current I2 flowing through the constant current source 28 is equal to the current I1 flowing through the constant current source 27, a following expression (3) is established.

$$I1 = I2 \quad (3)$$

Thus, the output current In22 of the current duplication circuit 24 is expressed by a following expression (4).

$$In22 = In21 + I1 - I2 \quad (4)$$
$$= In21$$

In other words, it can be understood that the current duplication circuit 24 outputs the noise current In21 as the output current In22.

As a the summation of the noise current In21 (i.e., the output current In22), the output current Iin of the current-voltage conversion circuit 25, the optical current Iopt, and the noise current In1 is zero due to Kirchhoff's law, a following expression (5) is established.

$$In21+Iin=Iopt+In1 \quad (5)$$

A following expression (6) is obtained by transforming the expression (5).

$$Iin=Iopt+In1-In21 \quad (6)$$

Here, a coefficient which is used when the current-voltage conversion circuit 25 converts the output current Iin into the voltage signal V1 is A. In this case, a following expression (7) is established.

$$V1=A*Iin+B \quad (7)$$

In the configuration of the current-voltage conversion circuit 25 shown in FIG. 2, the expression (7) can be transformed into a following expression (8).

$$V1=R1*Iin+VREF \quad (8)$$

Hereinafter, a relation expressed by the expression (8) is established between the voltage signal V1 and the output current Iin.

The expression (8) can be transformed into a following expression (9) using the expression (6).

$$V1=R1(Iopt+In1-In21)+VREF \quad (9)$$

According to the expression (9), it can be understood that the noise current In1 and the noise current In21 cancel each other. By designing as the light-receiving area of the optical signal detection photo diode 21 and the light-receiving area of the noise detection photo diode 22 are equal, a following expression (10) is established.

$$In1=In21 \quad (10)$$

As shown in an expression (11), it is possible to eliminate the effect of the noise current In1 from the voltage signal V1 and reflect only the optical current Iopt by using the expressions (10).

$$V1=R1*Iopt+VREF \quad (11)$$

According to the configuration, as shown in the expression (11), the current-voltage conversion circuit 25 can output the voltage signal V1 to which only the optical current mop reflects regardless of an effect of the noise. As a result, as the voltage signal V1 input to the comparator 26 is not affected by the noise, it can be understood that the output signal VOUT output from the light-receiving unit 20 is not also affected by the noise.

Figure 5:
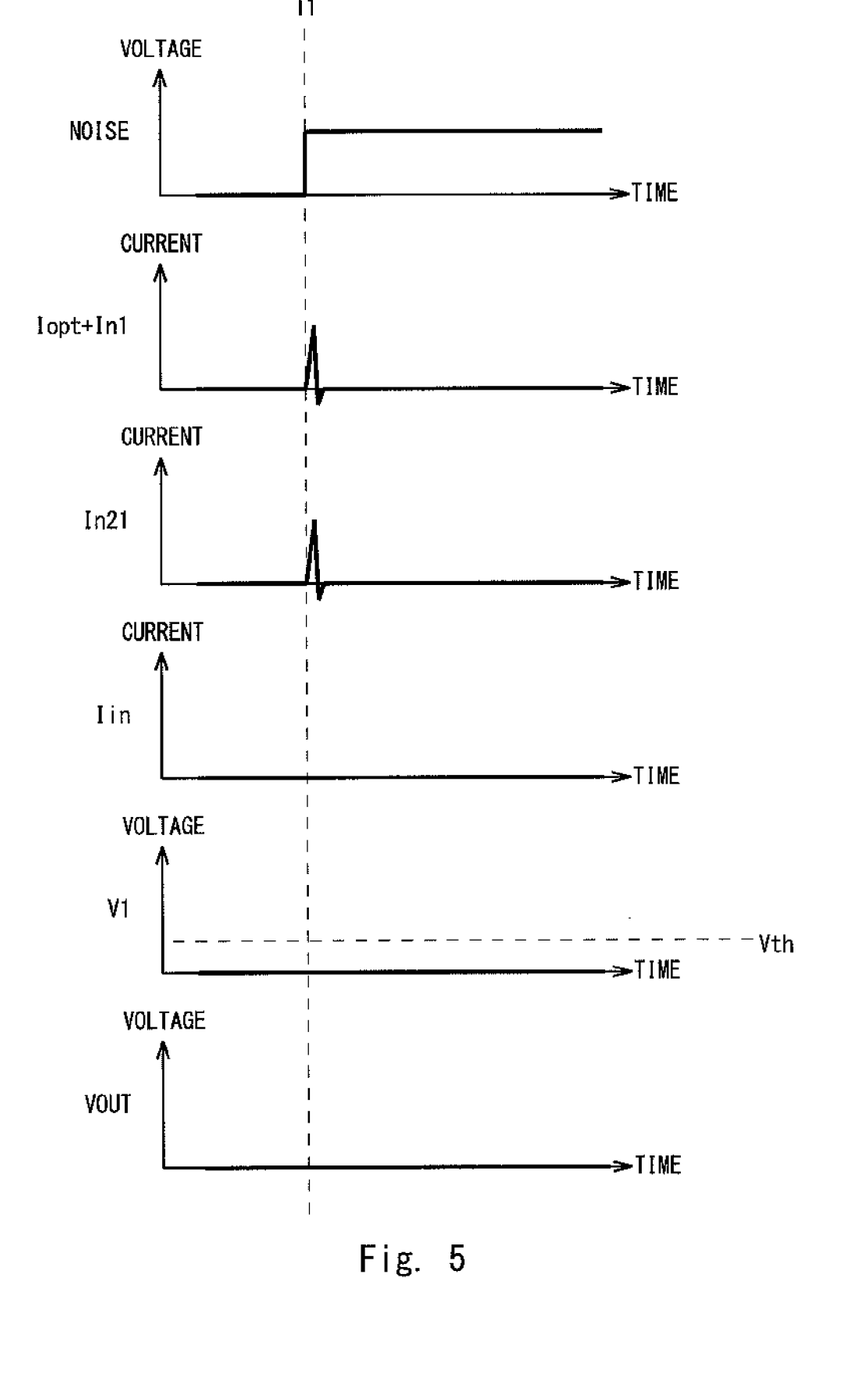
FIG. 5 is a timing chart of the signals when the optical signal is not incident to the optical signal detection photo diode in the photocoupler according to the first embodiment.

Next, an aspect of the signals in the photocoupler 1 will be described. Firstly, a case in which the optical signal L1 is not incident to the optical signal detection photo diode 21 will be considered. FIG. 5 is a timing chart of the signals when the optical signal L1 is not incident to the optical signal detection photo diode 21 in the photocoupler 1 according to the first embodiment. At an initial state, the optical signal L1 is not incident and the noise is not incident.

Thus, the output current Iopt+In1 of the optical signal detection photo diode 21 is "0". Therefore, the output current Iin of the current-voltage conversion circuit 25 is "0", and the voltage signal V1 of the current-voltage conversion circuit 25 is also "0". As a result, the output signal VOUT of the comparator 26 is "LOW".

Then, when the noise is input at a timing (a timing T1), a voltage due to the noise occurs and a change in the output current Iopt+In1 of the optical signal detection photo diode 21 occurs. As Ipot=0, the noise current In1 is output from the optical signal detection photo diode 21. Likewise, the noise current In21 is output from the noise detection photo diode 22.

As described above, as the noise current In1 and the noise current In21 cancel each other, the output current Iin of the current-voltage conversion circuit 25 is kept to "0", and the voltage signal V1 is kept to "LOW". As a result, as the output signal VOUT of the comparator 26 is kept to "0", it can be understood that the output signal VOUT is not affected by a malfunction due to the noise and so on.

Figure 6:
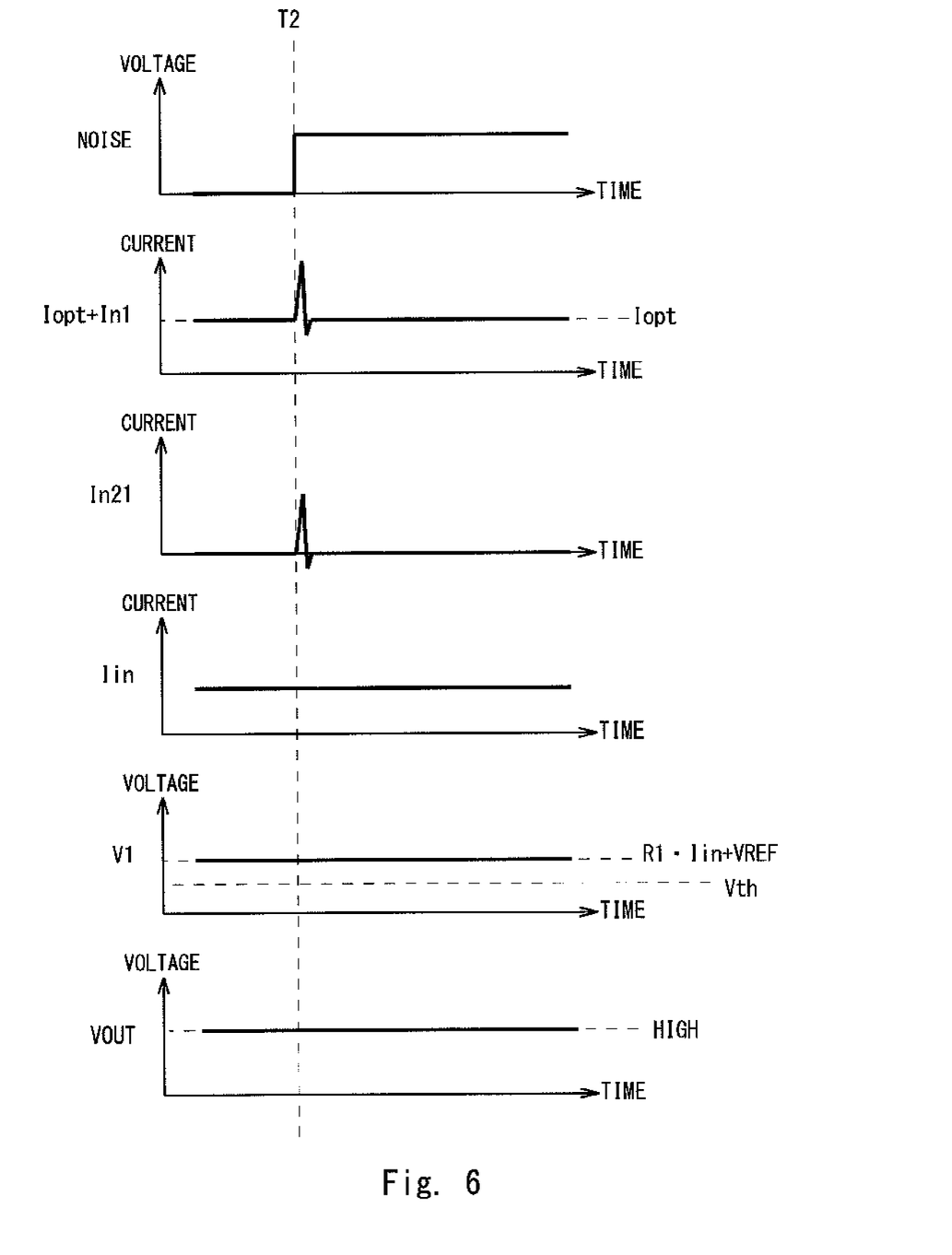
FIG. 6 is a timing chart of the signals when the optical signal is incident to the optical signal detection photo diode in the photocoupler according to the first embodiment.

Next, a case in which the optical signal L1 is incident to the optical signal detection photo diode 21 will be considered. FIG. 6 is a timing chart of the signals when the optical signal L1 is incident to the optical signal detection photo diode 21 in the photocoupler 1 according to the first embodiment. At the initial state, the optical signal L1 is incident and the noise is not incident. Thus, the output current Iopt+In1 of the optical signal detection photo diode 21 has a value corresponding to the optical signal L1. Therefore, the output current Iin of the current-voltage conversion circuit 25 has the same value as the optical current Ipo, and the voltage signal V1 of the current-voltage conversion circuit 25 is R1*Iopt+VREF. When the voltage signal V1 of the current-voltage conversion circuit 25 is larger than the threshold voltage Vth, the output signal VOUT of the comparator 26 is "HIGH".

Then, when the noise is input at a timing (a timing T2), a voltage due to the noise occurs and the noise current is added to the output current Iopt+In1 of the optical signal detection photo diode 21. Likewise, the noise current In21 is output from the noise detection photo diode 22.

As described above, as the noise current In1 and the noise current In21 cancel each other, the output current Iin of the current-voltage conversion circuit 25 is kept to the optical current Iopt, and the voltage signal V1 is kept to "R1*Iopt+VREF". As a result, as the output signal VOUT of the comparator 26 is kept to "HIGH", it can be understood that the output signal VOUT is not affected by the malfunction due to the noise and so on.

According to the configuration, in the optical coupling circuit, it is possible to eliminate the effect of the malfunction due to the noise on the output signal and so on.

Further, according to the configuration, the noise current is subtracted from the output current of the optical signal detection photo diode 21 without converting the noise current into the voltage signal. Thus, as the current-voltage conversion circuit 25 converts the current from which the effect of the noise is eliminated into the voltage, a dynamic range of the inside of the current-voltage conversion circuit 25 does not limit noise rejection ability. As the voltage signal from which the effect of the noise has already been eliminated is input to the comparator 26, a limitation caused by a directionality of the noise does not occur as compared with Japanese Unexamined Patent Application Publication No. 2006-300072.

Therefore, according to the configuration, in the optical coupling circuit, it is possible to eliminate the effect of the noise on the output signal regardless of a noise property.

Second Embodiment

Figure 7:
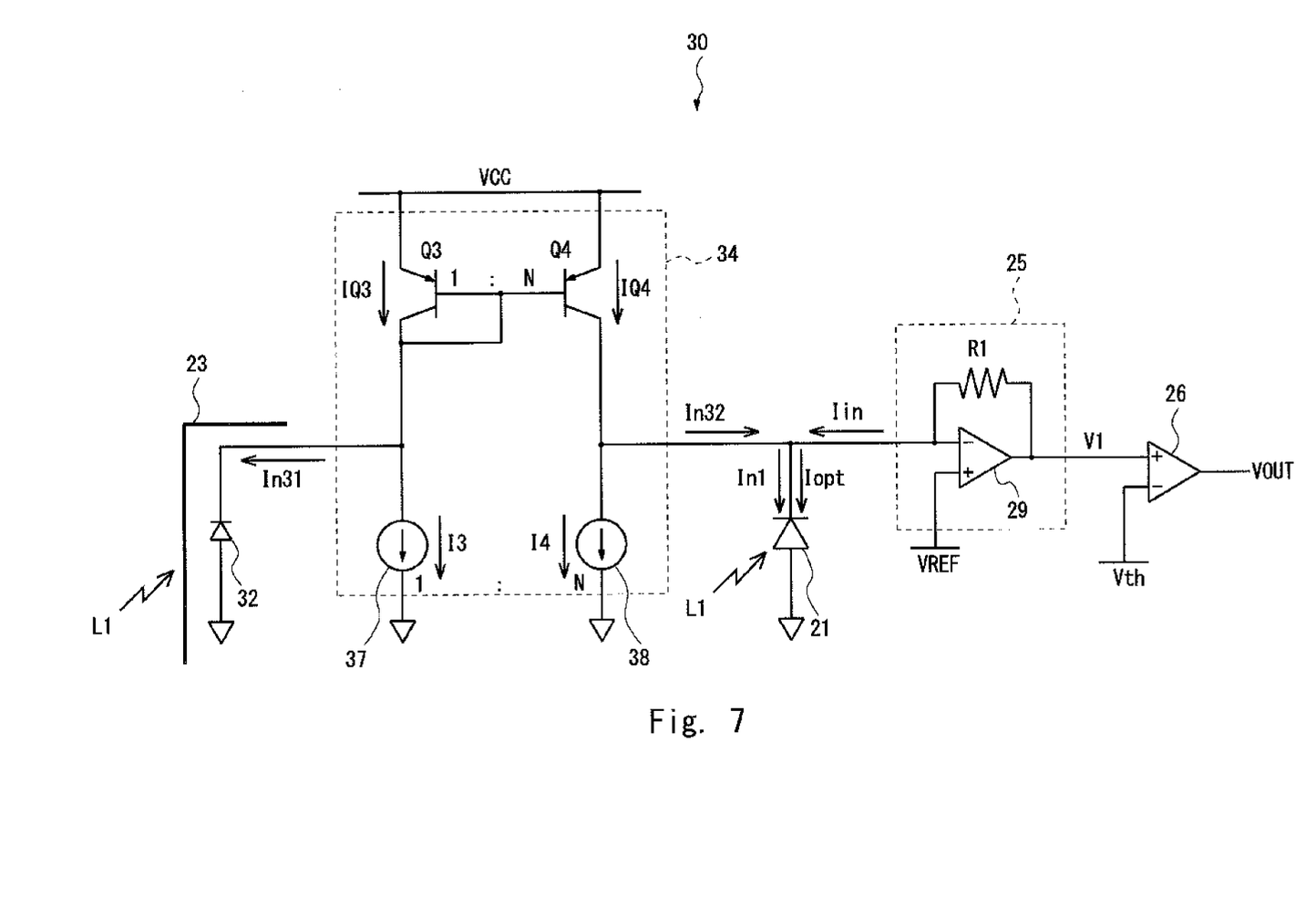
FIG. 7 is a circuit diagram schematically showing a configuration of a light-receiving unit in a photocoupler according to a second embodiment.

A photocoupler according to a second embodiment will be described. FIG. 7 is a circuit diagram schematically showing a configuration of a light-receiving unit 30 in a photocoupler 2 according to the second embodiment. The photocoupler 2 has a configuration in which the light-receiving unit 20 in the photocoupler 1 according to the first embodiment is replaced with the light-receiving unit 30. The light-receiving unit 30 has a configuration in which the noise detection photo diode 22 and the current duplication circuit 24 in the light-receiving unit 20 are replaced with a noise detection photo diode 32 and a current duplication circuit 34, respectively.

The noise detection photo diode 32 is optically shielded as in the case of the noise detection photo diode 22 according to the first embodiment. However, a light-receiving area of the noise detection photo diode 32 is 1/N of the light-receiving area of the noise detection photo diode 22. In other words, the light-receiving area of the noise detection photo diode 32 is 1/N of the light-receiving area of the optical signal detection photo diode 21. In this embodiment, a noise current flowing through the noise detection photo diode 32 is In31.

The current duplication circuit 34 has a configuration in which the bipolar transistors Q1 and Q2, the constant current sources 27 and 28 of the current duplication circuit 24 are replaced with bipolar transistors Q3 and Q4, constant current sources 37 and 38, respectively. In the first embodiment, it is described that the bipolar transistors Q1 and Q2 are the same size transistors. In contrast, the bipolar transistors Q3 and Q4 according to the second embodiment are transistors the sizes of which are different. Specifically, in this embodiment, a size ratio of the bipolar transistor Q3 and bipolar transistor Q4 is 1:N. Other configurations of the current duplication circuit 34 are the same as those of the current duplication circuit 24, description of those will be omitted. In the first embodiment, it is described that the constant current sources 27 and 28 output the currents of the same value. However, the constant current sources 37 and 38 output currents the values of which are different. In this embodiment, a current I3 flowing through the constant current sources 37 and current I4 flowing through the constant current sources 38 are designed to make a ratio of 1:N. Thus, the bipolar transistors Q3 and Q4, the constant current source 37 constitute a current mirror circuit the mirror ratio of which is 1:N.

Next, a current flowing through the current duplication circuit 34 will be described. A current IQ3 flows through the bipolar transistor Q3. As shown in FIG. 7, as the current IQ3 is a current in which a noise current 31 and the current I3 are added, a following expression (12) is established.

$$IQ3 = In31 + I3 \quad (12)$$

As shown in FIG. 7, the bipolar transistors Q3 and Q4, the constant current source 37 constitute a current mirror circuit the mirror ratio of which is 1:N. Thus, a current IQ4 flowing through the bipolar transistor Q4 is expressed by a following expression (13).

$$IQ4 = N(In31 + I3) \quad (13)$$

The current I4 flowing through the constant current sources 38 is N times of the current I3 flowing through the constant current sources 37, so that a following expression is established.

$$I4 = N*I3 \quad (14)$$

Therefore, an output current In32 of the current duplication circuit 34 is expressed by a following expression (15).

$$\begin{aligned} In32 &= IQ4 - N*I3 \\ &= N*In31 + N*I3 - N*I3 \\ &= N*In31 \end{aligned} \quad (15)$$

In sum, it can be understood that the current duplication circuit 34 outputs a current which is N times of the noise current In31 as the output current In32.

As a summation of the current which is N times of the noise current In31 (i.e., the output current In32), the output current Iin, the optical current Iopt, and the noise current In1 is zero due to Kirchhoff's law, a following expression (16) is established.

$$N*In31 + Iin = Iopt + In1 \quad (16)$$

An expression (17) is obtained by transforming the expression (16).

$$Iin = Iopt + In1 - N*In31 \quad (17)$$

In this embodiment, the above-mentioned expression (8) is established with respect to the current-voltage conversion circuit 25 as in the case of the first embodiment. Thus, the expression (8) can be transformed into an expression (18) using the expression (17).

$$V1 = R1(Iopt + In1 - N*In31) + VREF \quad (18)$$

According to the expression (18), it can be understood that the noise current In1 and the noise current In31 cancel each other. As described above, as the light-receiving area of the optical signal detection photo diode 21 and the light-receiving area of the noise detection photo diode 32 are N:1, the noise current In1 and the noise current In31 satisfies a relation expressed by a following expression (19).

$$In1 = N*In31 \quad (19)$$

As shown in an expression (20), it is possible to eliminate the effect of the noise current In1 from the voltage signal V1 and reflect only the optical current Iopt by using the expressions (19).

$$V1 = R1*Iopt + VREF \quad (20)$$

In sum, the expression (20) is the same formula as the expressions (11). Thus, it can be understood the light-receiving unit 30 can eliminate the effect of the noise current as in the case of the light-receiving unit 20 according to the first embodiment.

Further, according to the configuration, it is possible to downsize the noise detection photo diode 32 as compared with the optical signal detection photo diode 21. Additionally, it is possible to downsize one of the two transistors constituting the current mirror in the current duplication unit and the constant current source connected thereto. As a result, it is possible to downsize configurations that is necessary to eliminate the noise and suppress an increasing in the size of the optical coupling circuit.

Third Embodiment

Figure 8:
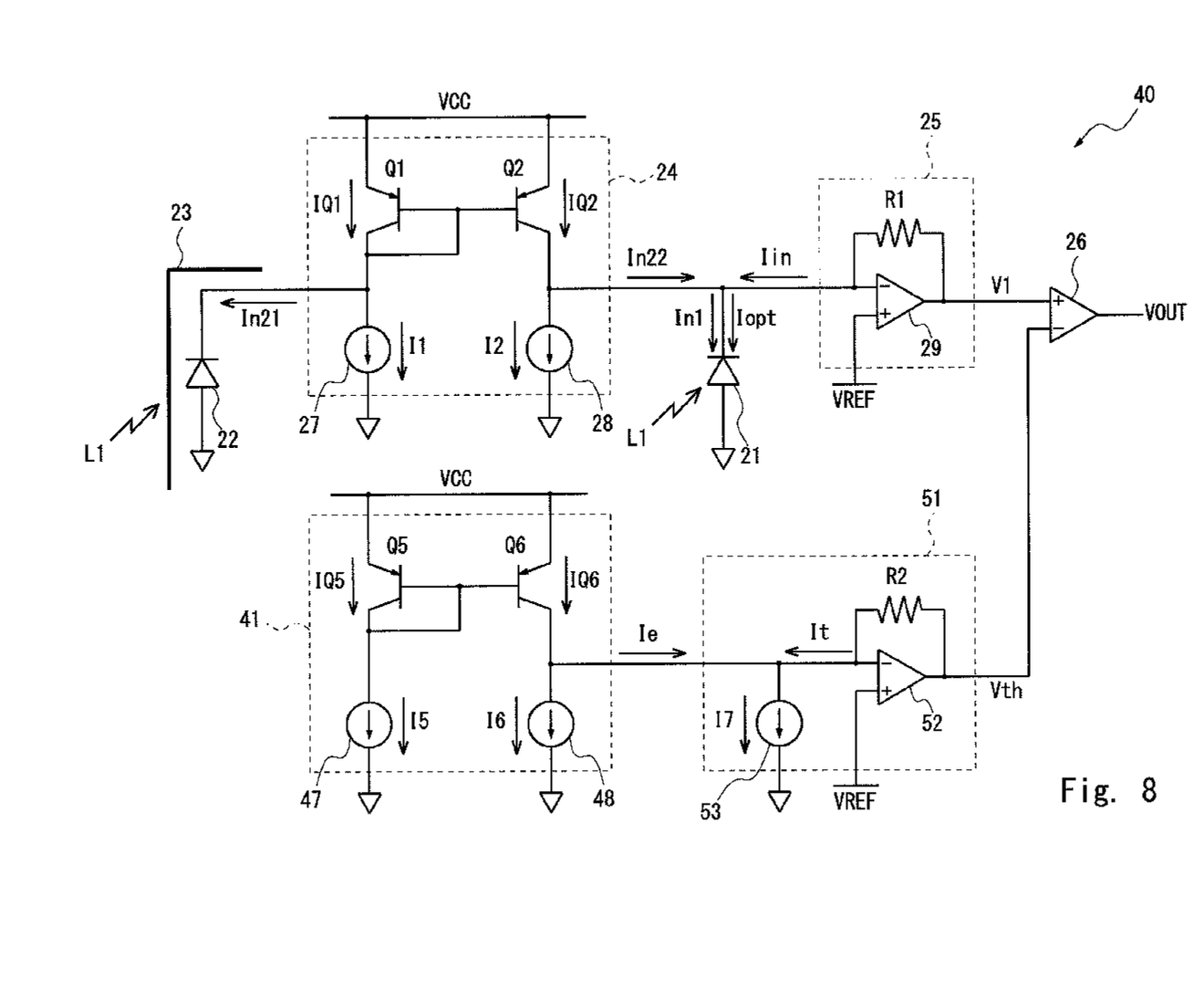
FIG. 8 is a circuit diagram schematically showing a configuration of a light-receiving unit in a photocoupler according to a third embodiment.

A photocoupler according to a third embodiment will be described. FIG. 8 is a circuit diagram schematically showing a configuration of a light-receiving unit 40 in a photocoupler 3 according to the third embodiment. The photocoupler 3 has a configuration in which a current generation circuit 41 and a threshold voltage generation circuit 51 are added to the photocoupler 1 according to the first embodiment.

The current generation circuit 41 includes bipolar transistors Q5 and Q6, constant current sources 47 and 48, and has the same configuration as the current duplication circuit 24. The bipolar transistors Q5 and Q6, the constant current sources 47 and 48 correspond to the bipolar transistors Q1 and Q2, the constant current sources 27 and 28 of the current duplication circuit 24, respectively.

The bipolar transistors Q5 and Q6 are PNP transistors. The emitters of the bipolar transistors Q5 and Q6 are supplied with a power-supply voltage VCC. The constant current source 47 is inserted between the collector of the bipolar transistor Q5 and the ground. The constant current source 47 outputs a constant current I5. According to the above description, the bipolar transistors Q5 and Q6, the constant current sources 47 constitute a current mirror circuit the mirror ratio of which is 1:1. The constant current source 48 is inserted between the collector of the bipolar transistor Q6 and the ground. The constant current source 48 outputs a constant current I6. The collector of the bipolar transistor Q6 is also connected to the threshold voltage generation circuit 51 as described hereinafter.

The threshold voltage generation circuit 51 includes a differential amplifier 52, a constant current source 53 and a resistor R2. The inverting input terminal of the differential amplifier 52 is connected to the collector of the bipolar transistor Q6. The constant current source 53 is inserted between the inverting input terminal of the differential amplifier 52 and the collector of the bipolar transistor Q6, and the ground. The non-inverting input terminal of the differential amplifier 52 is supplied with the reference voltage VREF. The resistor R2 is connected between the inverting input terminal of the differential amplifier 52 and the output terminal.

Next, an operation of the light-receiving unit 40 will be described. In the current duplication circuit 24 the bipolar transistors Q1 and Q2 constitute the current mirror the mirror ratio of which is 1:1. However, a variation in the mirror ratio practically occurs due to the Early effect. When the variation due to the Early effect is ΔI, a following expression (21) is established.

$$IQ1=IQ2+\Delta I \quad (21)$$

The current IQ1 is expressed by a following expression (22) as in the case of the expression (1) described above.

$$IQ1=In21+I1 \quad (22)$$

According to the expressions (21) and (22), a following expression (23) is obtained.

$$IQ2=In21+I1-\Delta I \quad (23)$$

As the current I2 flowing through the constant current source 28 is equal to the current I1 flowing through the constant current source 27, a following expression (24) is established as in the case of the expression (3) described above.

$$I1=I2 \quad (24)$$

Thus, the output current In22 of the current duplication circuit 24 is expressed by a following expression (25).

$$In22 = In21 + I1 - \Delta I - I2 \quad (25)$$

$$= In21 - \Delta I$$

Therefore, it can be understood that the current duplication circuit 24 outputs a current in which an error due to the Early effect affects the noise current 21 as the output current In22.

As the expression (8) described in the first embodiment is also established in the present embodiment, a following expression (26) is obtained according to the expressions (8) and (25).

$$V1=R1(Iopt+In1-In21+\Delta I)+VREF \quad (26)$$

When the expressions (9) and (26) are compared with each other, it can be understood that the voltage signal V1 of the current-voltage conversion circuit 25 according to the present embodiment includes an error ΔV1 caused by the Early effect that is expressed by the expression (27).

$$\Delta V1=R1*\Delta I \quad (27)$$

Next, an operation of the current generation circuit 41 will be described. The bipolar transistors Q5 and Q6, the constant current sources 47 constitute the current mirror the mirror ratio of which is 1:1. However, a variation in the mirror ratio occurs due to the Early effect as in the case of the current duplication circuit 24. As the bipolar transistors Q1, Q2, Q5 and Q6 are the same size transistors, respectively, an error of the current in the current generation circuit 41 due to the Early effect is ΔI as in the case of the current duplication circuit 24. Therefore, a following expression (28) is established.

$$IQ5=IQ6+\Delta I \quad (28)$$

A current IQ 5 is expressed by a following expression (29).

$$IQ5=I5 \quad (29)$$

According to the expressions (28) and (29), a following expression (30) is obtained.

$$IQ6=I5-\Delta I \quad (30)$$

When an output current of the current generation circuit 41 is Ie, a following expression (31) is established.

$$IQ6=I6+Ie \quad (31)$$

As the constant current source 47 and 48 are the same constant current source, a following expression (32) is established.

$$I5=I6 \quad (32)$$

According to the expressions (31) and (32), a following expression (33) is obtained.

$$Ie=-\Delta I \quad (33)$$

Then, an expression that expresses a condition for converting an output current It of the threshold voltage generation circuit 51 into the threshold voltage Vth is expressed by a following expression (34) as in the case of the expressions (8).

$$Vth=R2*It+VREF \quad (34)$$

According to Kirchhoff's law, a current I7 flowing through the constant current source 53, the output current Ie of the current generation circuit 41, and the output current It of the threshold voltage generation circuit 51 satisfy a relation expressed by a following expression (35).

$$I7 = It + Ie \tag{35}$$
$$= It - \Delta I$$

The expression (34) can be transformed into a following expression (36) using the expression (35).

$$Vth = R2(I7+\Delta I) + VREF \tag{36}$$

Here, the resistors R1 and R2 have the same resistance as expressed by an expression (37).

$$R2 = R1 \tag{37}$$

The expression (36) can be transformed into a following expression (38) using the expression (37).

$$Vth = R1(I7+\Delta I) + VREF \tag{38}$$

As shown in the expression (38), in this embodiment, it can be understood that the threshold voltage Vth includes an error $\Delta Vth$ caused by the Early effect that is expressed by the expression (39).

$$\Delta Vth = R1 * \Delta I \tag{39}$$

According to the expressions (27) and (39), a following expression (40) is established.

$$\Delta V1 = \Delta Vth \tag{40}$$

As described above, the errors due to the Early effect are included in the voltage signal V1 of the current-voltage conversion circuit 25 and the threshold voltage Vth. However, the errors due to the Early effect included in the voltage signal V1 of the current-voltage conversion circuit 25 and the threshold voltage Vth can be the same value in accordance with the light-receiving unit 30 according to this embodiment. Thus, the error due to the Early effect is substantially canceled in the comparison performed by the comparator 26. As a result, the error of the output signal VOUT caused by the Early effect of the transistor can be eliminated in accordance with the light-receiving unit 30 according to this embodiment.

Fourth Embodiment

Figure 9:
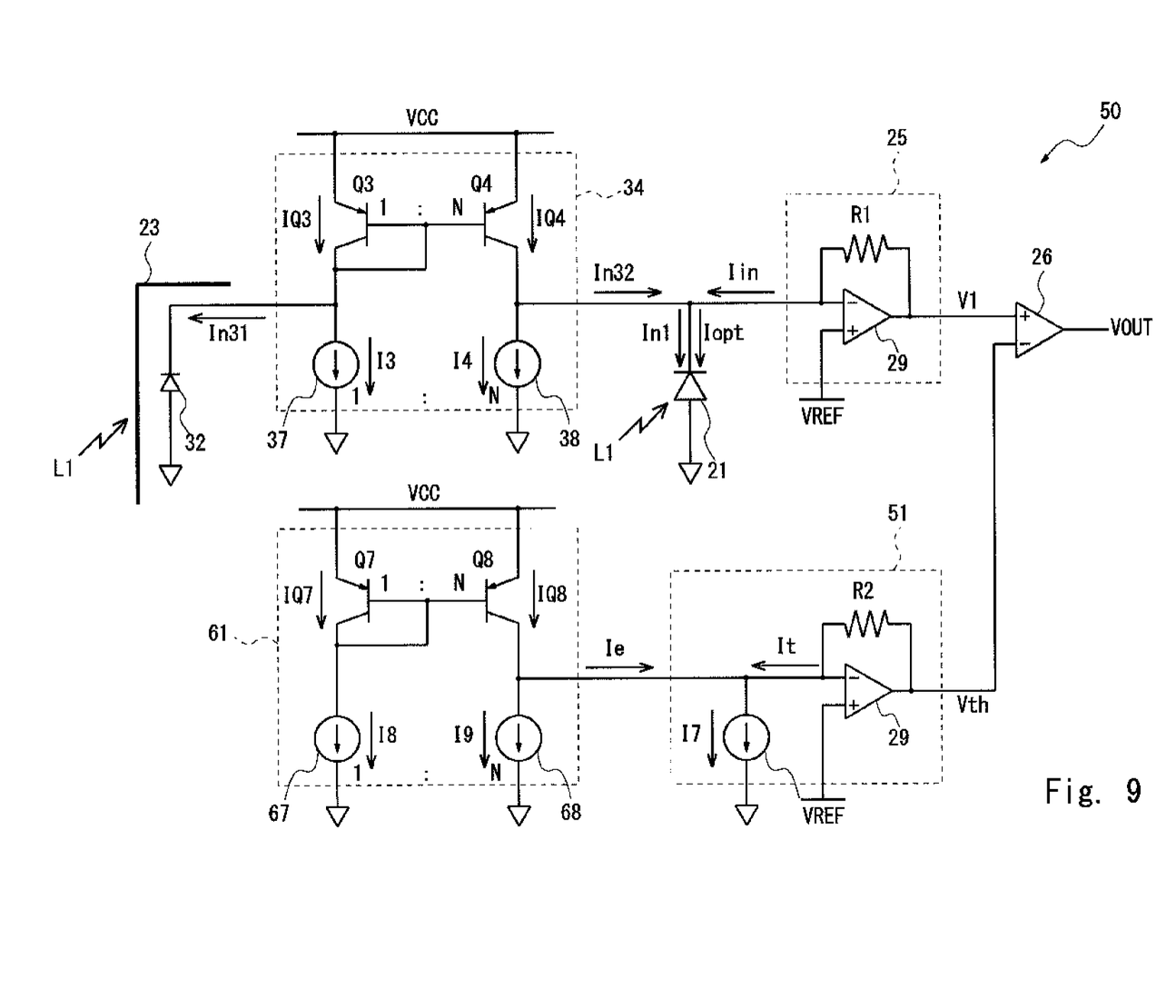
FIG. 9 is a circuit diagram schematically showing a configuration of a light-receiving unit in a photocoupler according to a fourth embodiment.

A photocoupler according to a fourth embodiment will be described. FIG. 9 is a circuit diagram schematically showing a configuration of a light-receiving unit 50 in a photocoupler 4 according to the fourth embodiment. The photocoupler 4 has a configuration in which a current generation circuit 61 and the threshold voltage generation circuit 51 are added to the photocoupler 2 according to the second embodiment.

The current generation circuit 61 has a configuration in which the bipolar transistors Q5 and Q6, the constant current sources 47 and 48 of the current generation circuit 41 are replaced with bipolar transistors Q7 and Q8, constant current sources 67 and 68, respectively. In the third embodiment, it is described that the bipolar transistors Q5 and Q6 are the same size transistors. In contrast, the bipolar transistors Q7 and Q8 according to the fourth embodiment are transistors the sizes of which are different. Specifically, in the present embodiment, a size ratio of the bipolar transistors Q7 and Q8 is 1:N as in the case of the transistors Q3 and Q4 in the current duplication circuit 34. In the third embodiment, it is described that the constant current sources 47 and 48 output the currents of the same value. However, the constant current sources 67 and 68 output currents the values of which are different. In this embodiment, a current I8 flowing through the constant current sources 67 and a current I9 flowing through the constant current sources 68 are designed to make a ratio of 1:N. Other configurations of the current generation circuit 61 are the same as those of the current generation circuit 41, description of those will be omitted.

Next, an operation of the light-receiving unit 40 will be described. A variation in the mirror ratio (1:N) of the current mirror consisted of the bipolar transistors Q3 and Q4 practically occurs due to the Early effect in the current duplication circuit 34 as in the case of the current duplication circuit 24 according to the third embodiment. In this case, the variation due to the Early effect is N times of the second embodiment, or $N*\Delta I$.

Therefore, it can be understood that the voltage signal V1 of the current-voltage conversion circuit 25 according to this embodiment includes the error $\Delta V1$ that is caused by the early Effect expressed by an expression (41).

$$\Delta V1 = N * R1 * \Delta I \tag{41}$$

The mirror ratio (1:N) of the current mirror consisted of the bipolar transistors Q7 and Q8 practically occurs due to the Early effect in the current generation circuit 61 as in the case of the current duplication circuit 24 according to the third embodiment. In this case, the variation due to the Early effect is $N*\Delta I$ as in the case of the current duplication circuit 34 according to the present embodiment.

Therefore, it can be understood that the threshold voltage Vth includes the error $\Delta Vth$ that is expressed by an expression (42) in this embodiment.

$$\Delta Vth = N * R1 * \Delta I \tag{42}$$

According to the expressions (41) and (42), a following expression (43) is established.

$$\Delta V1 = \Delta Vth \tag{43}$$

As described above, the errors due to the Early effect are included in the voltage signal V1 of the current-voltage conversion circuit 25 and the threshold voltage Vth. However, the errors due to the Early effect included in the voltage signal V1 of the current-voltage conversion circuit 25 and the threshold voltage Vth can be the same value in accordance with the light-receiving unit 50 according to this embodiment. Thus, the error due to the Early effect is substantially canceled in the comparison performed by the comparator 26. As a result, the error of the output signal VOUT caused by the Early effect of the transistor can be eliminated in accordance with the light-receiving unit 50 according to this embodiment.

Fifth Embodiment

Figure 10:
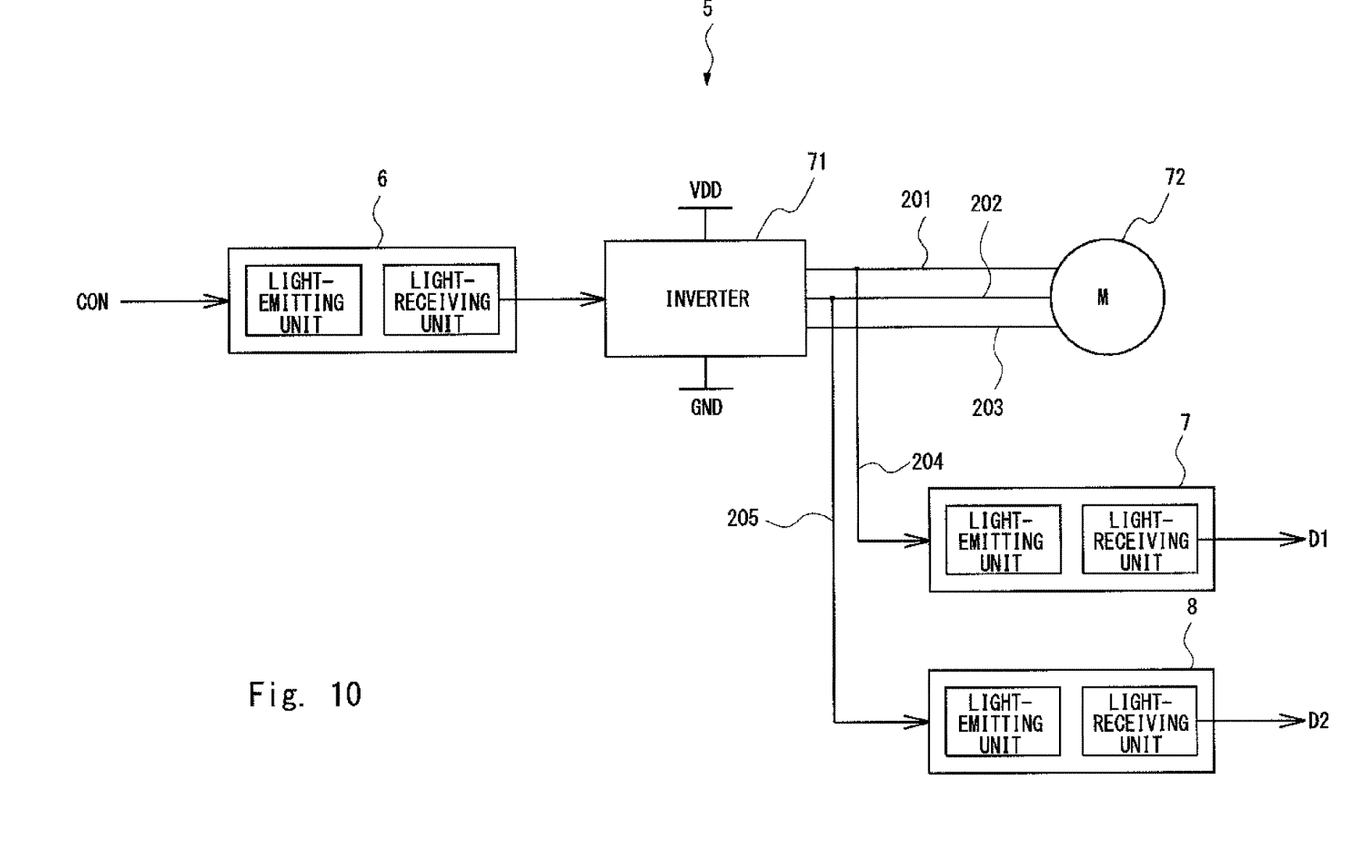
FIG. 10 is a circuit diagram showing a configuration of a motor drive system according to a fifth embodiment.

In the present embodiment, a system in which a signal is transmitted using the photocoupler described in any one of the first to fourth embodiments. Here, a motor driving system in which the photocoupler is used is described as an example. FIG. 10 is a circuit diagram showing a configuration of a motor drive system 5 according to the fifth embodiment. The motor drive system 5 includes photocouplers 6 to 8, an inverter 71, and a three-phase alternating-current (AC) motor 72. Any one of the photocouplers 1 to 4 is used as each of the photocouplers 6 to 8.

A control signal CON is input to the inverter 71 via the photocoupler 6. The inverter 71 outputs three phases based on the control signal CON. The three phases are supplied to the three-phase AC motor 72 via wirings 201 to 203, respectively.

A wiring 204 is pulled out from the wiring 201, and the wiring 204 is connected to an input of the photocoupler 7. A wiring 205 is pulled out from the wiring 202, and the wiring 205 is connected to an input of the photocoupler 8. An output of the photocoupler 7 and an output of the photocoupler 8 are connected to a voltage monitoring circuit (not shown in the drawings), for example. In this case, the voltage monitoring circuit can monitor a condition of power output to the three-phase AC motor 72 through the photocouplers.

It is generally desirable that the three-phase AC motor 72 is driven by high voltage to output great drive power from the three-phase AC motor 72. Thus, the inverter 71 is connected to a high voltage power source. In contrast, a control system for outputting the control signal CON and a monitoring system such as the voltage monitoring circuit described above are operated at a lower voltage than the inverter 71 and three-phase AC motor 72.

As the photocouplers are inserted between the inverter 71 and three-phase AC motor 72, and the control system and monitoring system that are outside of the inverter 71 and three-phase AC motor 72 in this embodiment, a high voltage operation and a low voltage operation part can be electrically insulated. Thus, while each of the parts that are operated at different voltages can be independently operated at a desirable voltage, a signal transmission between the parts operated at the different voltages can be achieved.

Further, the signal can be correctly transmitted between the parts operated at the different voltages regardless of being affected by the noise cause by the capacitive coupling inside the photocoupler by using any one of the photocouplers described in the first to fourth embodiments.

Note that the present invention is not limited to the above exemplary embodiments, and modifications can be made as appropriate without departing from the scope of the present invention. For example, the configurations of the current duplication circuit, the current-voltage conversion circuit, the current generation circuit, and the threshold voltage generation circuit described above are merely examples. As long as the same function can be exerted, other configurations can be also used as appropriate.

The configurations of the optical signal detection photo diode and noise detection photo diode described above are merely examples. That is, another type photo diode such as a PIN photo diode and an aberrance photo diode which has other configuration may be also used. Further, the photo diode is not limited to the photo diode made of silicon material. A photo diode, which is made of compound semiconductor material such as InP-based material, and so on may be also used.

In the embodiments described above, the current duplication circuit and current generation circuit include the bipolar transistor. However, it is merely examples. For example, another type transistor such as a MOS transistor may be also used.

Although the invention made by the present inventors has been explained based on the embodiments, it is obvious that the present invention is not limited to the already-described embodiments and various modifications can be made within the range not departing from the scope.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first to fifth embodiments can be combined as desirable by one of ordinary skill in the art.

What is claimed is:

1. An optical coupling circuit, comprising:
 a light-emitting unit that outputs an optical signal corresponding to an input electric signal; and
 a light-receiving unit that is electrically insulated from the light-emitting unit and outputs an electric signal according to the received optical signal as an output signal, wherein
 the light-receiving unit comprises;
  a first light-receiving device that outputs an optical current according to the optical signal;
  a second light-receiving device that is provided not to receive the optical signal;
  a current duplication circuit that duplicates a current flowing through the second light-receiving device;
  a current-voltage conversion circuit that converts a current, which is generated by subtracting the current duplicated by the current duplication circuit from a current flowing through the first light-receiving device, into a voltage signal; and
  a comparator that outputs a result of a comparison between the voltage signal converted by the current-voltage conversion circuit and a threshold voltage as the output signal.

2. The optical coupling circuit according to claim 1, wherein
 the first light-receiving device and the second light-receiving device are electrically insulated from the light-emitting unit, and
 noise currents flow through the first light-receiving device and the second light-receiving device, the noise currents being caused by the a capacitive coupling between the first light-receiving device and the second light-receiving device, and the light-emitting unit.

3. The optical coupling circuit according to claim 1, wherein
 the current duplication circuit comprises;
 a first constant current source and a first transistor that are connected between a first power supply and a second power supply in cascade,
 a second constant current source and a second transistor that are connected between the first power supply and the second power supply in cascade,
 one end of the second light-receiving device is connected to a node between the first transistor and the first constant current source,
 a control terminal of the first transistor is connected to one end of the first transistor and a control terminal of the second transistor, and the first and second transistors and the first constant current source constitute a current mirror circuit, and
 one end of the first light-receiving device and the current-voltage conversion circuit are connected to a node between the second transistor and the second constant current source.

4. The optical coupling circuit according to claim 3, wherein
 a light-receiving area of the first light-receiving device is the same as a light-receiving area of the second light-receiving device,
 the first and second transistors are the same size transistors, and the first and second constant current sources output currents of the same value.

5. The optical coupling circuit according to claim 4, further comprising:
a current generation circuit that outputs a first current; and
a threshold voltage generation circuit that converts a current signal into the threshold voltage and outputs the threshold voltage, wherein
the current generation circuit comprise:
a third constant current source and a third transistor that are connected between the first power supply and the second power supply in cascade; and
a fourth constant current source and a fourth transistor that are connected between the first power supply and the second power supply in cascade,
the threshold voltage generation circuit is connected to a node between the fourth transistor and the fourth constant current source,
the third transistor and the fourth transistor are the same size transistor, and
the third constant current source and fourth constant current source output currents of the same value.

6. The optical coupling circuit according to claim 3, wherein
the light-receiving area of the first light-receiving unit is an area the size of which is a predetermined ratio as compared with the area of the second light-receiving unit,
the first transistor is a transistor the size of which is a predetermined ratio as compared with the second transistor, and
the first constant current source outputs a current the value of which is a predetermined ratio as compared with the second constant current source.

7. The optical coupling circuit according to claim 6, further comprising:
a current generation circuit that outputs a first current; and
a threshold voltage generation circuit that converts a current signal into the threshold voltage and outputs the threshold voltage, wherein
the current generation circuit comprise:
a third constant current source and a third transistor that are connected between the first power supply and the second power supply in cascade; and
a fourth constant current source and a fourth transistor that are connected between the first power supply and the second power supply in cascade,
the threshold voltage generation circuit is connected to a node between the fourth transistor and the fourth constant current source,
the third transistor is a transistor the size of which is a predetermined ratio as compared with the fourth transistor, and
the third constant current source outputs a current the value of which is a predetermined ratio as compared with the fourth constant current source.

8. A light-receiving apparatus of an optical coupling circuit, comprising:
a first light-receiving device that outputs an optical current according to the optical signal;
a second light-receiving device that is provided not to receive the optical signal;
a current duplication circuit that duplicates a current flowing through the second light-receiving device;
a current-voltage conversion circuit that converts a current, which is generated by subtracting the current duplicated by the current duplication circuit from a current flowing through the first light-receiving device, into a voltage signal; and
a comparator that output a result of a comparison between the voltage signal converted by the current-voltage conversion circuit and a threshold voltage as the output signal,
wherein the first light-receiving device and the second light-receiving device are electrically insulated from a light-emitting unit that outputs an optical signal corresponding to an input electric-signal.

9. A signal processing apparatus, comprising:
a signal generation unit that outputs an output electric signal according to an input electric signal; and
an optical coupling circuit to which an electric signal is applied, an input and an output thereof are electrically insulated; wherein
the optical coupling circuit is inserted one or both of a path through which the input electric signal is input to the signal generation unit and a path through which the output electric signal is output from the signal generation unit;
the optical coupling circuit comprises;
a light-emitting unit that outputs an optical signal corresponding to an input electric signal; and
a light-receiving unit that is electrically insulated from the light-emitting unit and outputs an electric signal according to the received optical signal as an output signal,
the light-receiving unit comprises;
a first light-receiving device that outputs an optical current according to the optical signal;
a second light-receiving device that is provided not to receive the optical signal;
a current duplication circuit that duplicates a current flowing through the second light-receiving device;
a current-voltage conversion circuit that converts a current, which is generated by subtracting the current duplicated by the current duplication circuit from a current flowing through the first light-receiving device, into a voltage signal; and
a comparator that output a result of a comparison between the voltage signal converted by the current-voltage conversion circuit and a threshold voltage as the output signal.

* * * * *